(12) United States Patent
Han et al.

(10) Patent No.: US 12,069,907 B2
(45) Date of Patent: Aug. 20, 2024

(54) DISPLAY PANEL AND DISPLAY DEVICE

(71) Applicant: WUHAN TIANMA MICRO-ELECTRONICS CO., LTD., Wuhan (CN)

(72) Inventors: Lijing Han, Shanghai (CN); Xian Chen, Shanghai (CN); Yu Xin, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 18/302,216

(22) Filed: Apr. 18, 2023

(65) Prior Publication Data
US 2023/0371320 A1    Nov. 16, 2023

Related U.S. Application Data

(63) Continuation of application No. 17/473,361, filed on Sep. 13, 2021, now Pat. No. 11,690,260, which is a
(Continued)

(30) Foreign Application Priority Data

Nov. 23, 2018 (CN) .......................... 201811404221.X

(51) Int. Cl.
*H10K 59/126* (2023.01)
*H10K 59/121* (2023.01)
*H10K 59/131* (2023.01)

(52) U.S. Cl.
CPC ....... *H10K 59/126* (2023.02); *H10K 59/1213* (2023.02); *H10K 59/1216* (2023.02); *H10K 59/131* (2023.02)

(58) Field of Classification Search
CPC ............. H01L 27/3272; H01L 27/3262; H01L 27/3265; H01L 27/3276; H10K 59/126;
(Continued)

(56) References Cited

U.S. PATENT DOCUMENTS 7,714,810 B2    5/2010   Kasai
8,130,176 B2    3/2012   Kasai
(Continued)

FOREIGN PATENT DOCUMENTS

CN    103872080 A    6/2014
CN    105679792 A    6/2016
(Continued)

OTHER PUBLICATIONS

Chinese Office Action dated Dec. 16, 2019 for corresponding Chinese Patent Application No. 201811404221.X.

*Primary Examiner* — Eric W Jones
(74) *Attorney, Agent, or Firm* — Tarolli, Sundheim, Covell & Tummino LLP

(57) ABSTRACT

The present disclosure provides a display panel and a display device. The display panel includes pixel circuits arranged in a matrix, and a blocking unit. Each pixel circuit includes: a driving transistor; a first switch transistor; a second switch transistor; and a third switch transistor. The blocking unit is configured to receive a fixed potential signal, and at least a partial area of the blocking unit is located between a first semiconductor connection portion and a second semiconductor connection portion, the first semiconductor connection portion is connected between a second electrode of the first switch transistor and a gate electrode of the driving transistor, and the second semiconductor connection portion is electrically connected between a first electrode of the second switch transistor and a data line.

20 Claims, 7 Drawing Sheets

Related U.S. Application Data continuation of application No. 16/358,924, filed on Mar. 20, 2019, now Pat. No. 11,152,445.

(58) Field of Classification Search
CPC ............. H10K 59/131; H10K 59/1213; H10K 59/1216
USPC .................................................... 257/40, 59
See application file for complete search history.

(56) References Cited

U.S. PATENT DOCUMENTS

| | | |
|---|---|---|
| 8,188,943 B2 | 5/2012 | Kasai |
| 8,643,573 B2 | 2/2014 | Kasai |
| 11,152,445 B2 | 10/2021 | Han |
| 2005/0287750 A1 | 12/2005 | Lee |
| 2013/0321248 A1 | 12/2013 | Kimura |
| 2014/0292622 A1 | 10/2014 | Lee |
| 2016/0260792 A1 | 9/2016 | Kim |
| 2019/0206969 A1 | 7/2019 | Hwang |

FOREIGN PATENT DOCUMENTS

| | | |
|---|---|---|
| CN | 107274830 A | 10/2017 |
| CN | 107527590 A | 12/2017 |

DISPLAY PANEL AND DISPLAY DEVICE

CROSS-REFERENCE TO RELATED APPLICATIONS

This application is a continuation of U.S. patent application Ser. No. 17/473,361, filed on Sep. 13, 2021, which is a continuation of U.S. patent application Ser. No. 16/358,924, filed on Mar. 20, 2019, which claims priority to Chinese Patent Application No. 201811404221.X, filed on Nov. 23, 2018. All of the aforementioned patent applications are hereby incorporated by reference in their entireties.

TECHNICAL FIELD

The present disclosure relates to the field of display technologies, and in particular, to a display panel and a display device.

BACKGROUND

With the development of display technologies, an organic light-emitting display panel has been more and more widely used due to the excellent characteristics such as self-luminescence, high brightness, wide viewing angle, and fast response. However, in recent years, as the resolution has been continuously increased, a gap between metal film layers, in which signal lines and transistors are formed, of the organic light-emitting display panel has become small. As a result, a serious coupling effect is generated between the metal film layers and coupling capacitance is therefore formed, thereby affecting light-emitting brightness of a light-emitting element and the display performance.

SUMMARY

In view of this, the present disclosure provides a display panel and a display device, aiming to reduce coupling capacitance between a gate of a driving transistor and a data line, thereby improving the display performance.

In an aspect, the present disclosure provides a display panel, and the display panel includes a plurality of pixel circuits arranged in a matrix, and a blocking unit. Each of the plurality of pixel circuits includes: a driving transistor having a gate electrode and a first electrode; a first switch transistor having a gate electrode electrically connected to a first scanning signal line, a first electrode electrically connected to a reference voltage signal line, and a second electrode electrically connected to the gate electrode of the driving transistor; a second switch transistor having a gate electrode electrically connected to a second scanning signal line, a first electrode electrically connected to a data line, and a second electrode electrically connected to the first electrode of the driving transistor; and a third switch transistor having a gate electrode electrically connected to a light-emitting control signal line, a first electrode electrically connected to a power supply voltage signal line, and a second electrode electrically connected to the first electrode of the driving transistor. The blocking unit is configured to receive a fixed potential signal, and at least a partial area of the blocking unit is located between a first semiconductor connection portion and a second semiconductor connection portion, the first semiconductor connection portion is a semiconductor electrically connected between the second electrode of the first switch transistor and the gate electrode of the driving transistor, and the second semiconductor connection portion is a semiconductor electrically connected between the first electrode of the second switch transistor and the data line.

In another aspect, the present disclosure provides a display device including the display panel described above.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

Figure 1:
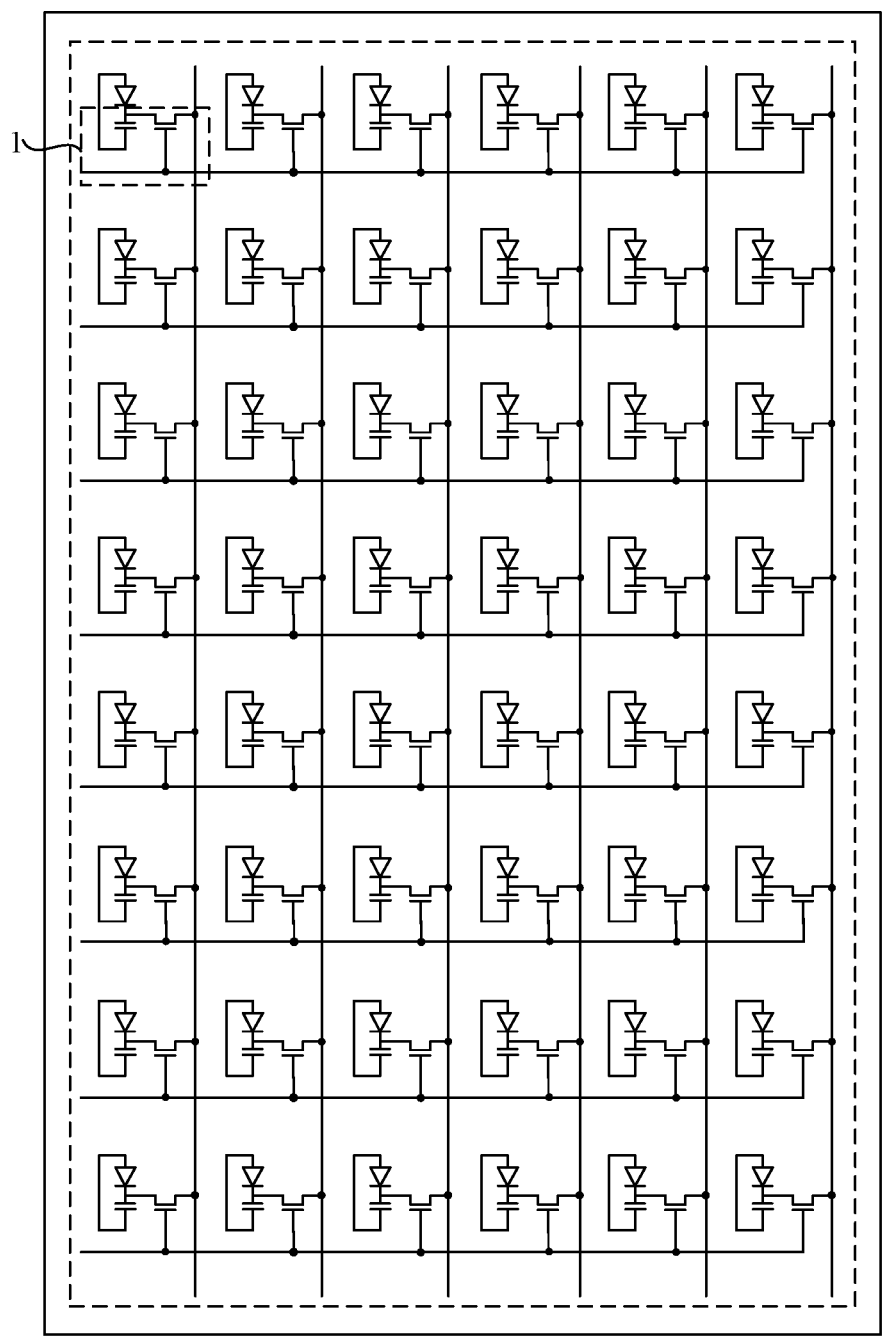
FIG. 1 is a top view of a display panel according to an embodiment of the present disclosure.

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although the switch transistor may be described using the terms of "first", "second" and "third", etc., in the embodiments of the present disclosure, the switch transistor will not be limited to these terms. These terms are merely used to distinguish switch transistors from one another. For example, without departing from the scope of the embodiments of the present disclosure, a first switch transistor may also be referred to as a second switch transistor, and similarly, a second switch transistor may also be referred to as a first switch transistor.

In order to further illustrate beneficial effects of the embodiments of the present disclosure, the disadvantages in the related art will be described before describing the embodiments of the present disclosure.

In the related art, a display panel includes a plurality of pixel units defined by gate lines intersecting with data lines. Each pixel unit includes a pixel circuit and a light-emitting element electrically connected to the pixel circuit. Each pixel circuit includes a driving transistor and a plurality of switch transistors.

However, as the resolution continues to increase, a gap between metal film layers, in which signal lines and transistors are formed, in the organic light-emitting display panel has become small. As a result, a serious coupling effect is generated between the metal film layers, and coupling capacitance is therefore formed, which further leads to an unexpected electric field. If coupling capacitance is formed between a gate electrode of the driving transistor and the data line, the driving current flowing into the light-emitting element is affected. Then, the actual light-emitting brightness of the light-emitting element deviates from the standard light-emitting brightness, thereby causing crosstalk in the displayed image and thus reducing the display performance.

When ignoring the coupling capacitance between the gate electrode of the driving transistor and the data line, the standard driving current flowing into the light-emitting element is $I = k(V_{pvdd} - V_{data2})^2$. Herein, $k = \frac{1}{2}\mu_n C_{ox} W/L$, $\mu_s$ is a migration rate of the electron, $C_{ox}$ is a gate oxide capacitance per unit area, and W/L is a width-to-length ratio of a channel of the driving transistor.

When considering the coupling capacitance c between the gate electrode of the driving transistor and the data line, the actual driving current flowing into the light-emitting element is $$I' = k\left(V_{pvdd} - V_{data2} - \frac{\Delta V \times c}{c + Cst}\right)^2.$$

Herein, ΔV is a voltage difference between data signals provided by the data line at two moments, and Cst is a storage capacitance.

It can be seen that the larger the coupling capacitance c between the gate electrode of the driving transistor and the data line is, the larger the difference between the actual driving current I' and the standard driving current I, and the more the actual light-emitting brightness of the light-emitting element deviates from the standard light-emitting brightness, the more obvious the crosstalk is.

Figure 2:
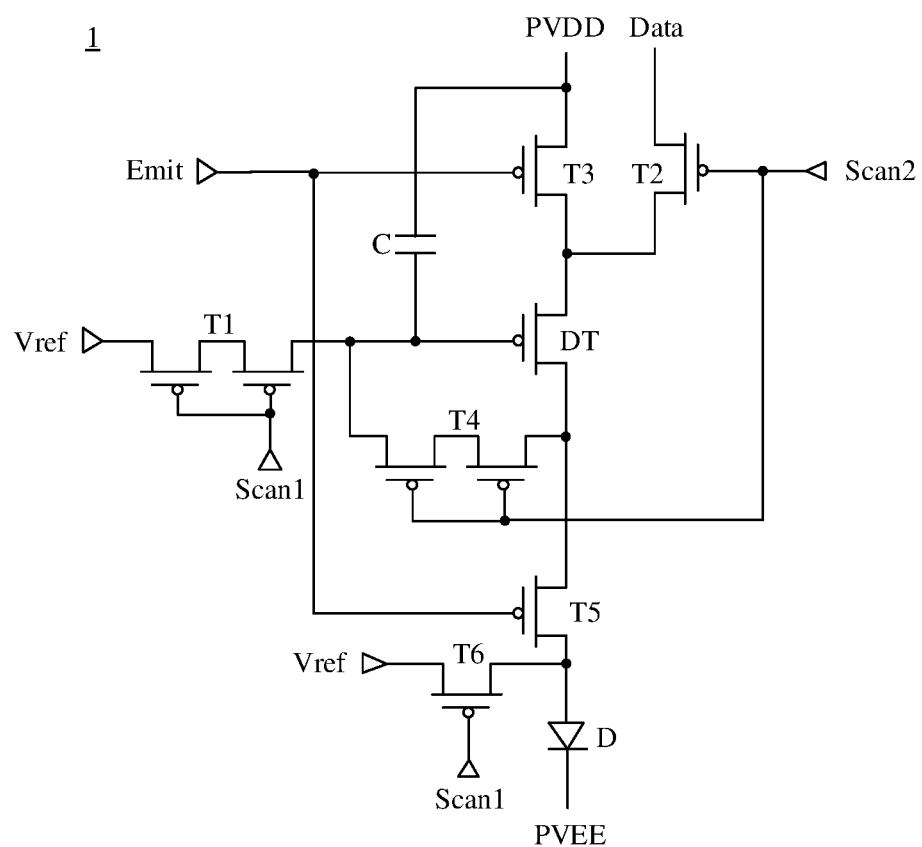
FIG. 2 is a schematic structural diagram of a pixel circuit according to an embodiment of the present disclosure.
Figure 3:
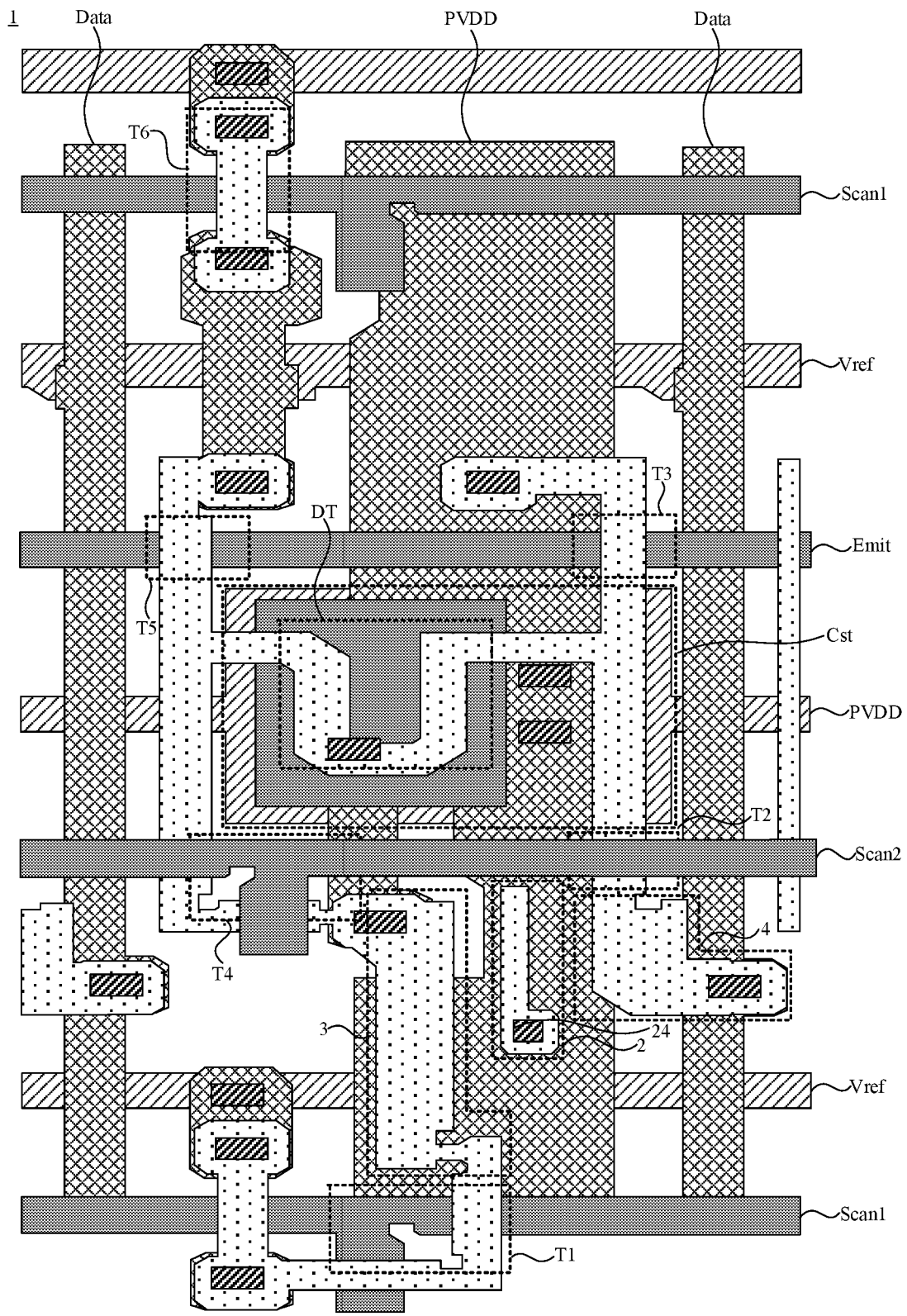
FIG. 3 is a schematic structural view of a layout corresponding to FIG. 2.

An embodiment of the present disclosure provides a display panel as shown in FIGS. 1 to 3. FIG. 1 is a top view of a display panel according to an embodiment of the present disclosure. FIG. 2 is a schematic structural diagram of a pixel circuit according to an embodiment of the present disclosure. FIG. 3 is a schematic structural view of a layout corresponding to FIG. 2. As shown in FIGS. 1-3, the display panel includes a plurality of pixel circuits 1 arranged in a matrix. Each pixel circuit 1 includes a driving transistor DT, a first switch transistor T1, a second switch transistor T2, and a third switch transistor T3.

The first switch transistor T1 has a gate electrode electrically connected to a first scanning signal line Scan1, a first electrode electrically connected to a reference voltage signal line Vref, and a second electrode electrically connected to a driving transistor DT. The second switch transistor T2 has a gate electrode electrically connected to a second scanning signal line Scan2, a first electrode electrically connected to a data line Data, and a second electrode electrically connected to a first electrode of the driving transistor DT. The third switch transistor T3 has a gate electrode electrically connected to a light-emitting control signal line Emit, a first electrode electrically connected to a power supply voltage signal line PVDD, and a second electrode electrically connected to the first electrode of the driving transistor DT.

Further, the display panel further includes a blocking unit 2 that receives a fixed potential signal. At least a partial area of the blocking unit 2 is located between a first semiconductor connection portion 3 and a second semiconductor connection portion 4. Herein, the first semiconductor connection portion 3 is a semiconductor electrically connected between the second electrode of the first switch transistor T1 and the gate electrode of the driving transistor DT, and the second semiconductor connection portion 4 is a semiconductor electrically connected between the first electrode of the second switch transistor T2 and the data line Data.

It should be noted that a film layer where the first semiconductor connection portion 3 and the second semiconductor connection portion 4 are located is a semiconductor layer in a layout structure. The semiconductor layer further includes a channel portion of the transistor in addition to the semiconductor connection portions for connection. The channel portion has two ends that are respectively a first electrode and a second electrode of the transistor. Here, the first electrode is a source electrode and the second electrode is a drain electrode, or the first electrode is a drain electrode and the second electrode is a source electrode. The first and second electrodes are doped semiconductors, and can directly achieve current transmission. The channel portion is a semiconductor overlapping the gate electrode of the transistor. A voltage signal applied to the gate electrode can control the channel portion to be switched on or off, thereby switching on or off the transistor.

For the display panel provided by this embodiment of the present disclosure, when a coupling effect is generated between the first semiconductor connection portion 3 and the second semiconductor connection portion 4 to generate a coupling electric field, since the blocking unit 2 is arranged between the first semiconductor connection portion 3 and the second semiconductor connection portion 4 and is configured to receive a fixed voltage potential, the blocking unit 2 can at least partially block electric field lines formed between the first semiconductor connection portion 3 and the second semiconductor connection portion 4. In this way, the coupling electric field therebetween can be reduced, thereby reducing the coupling capacitance therebetween. Moreover, the first semiconductor connection portion 3 is electrically connected to the gate electrode of the driving transistor DT, and the second semiconductor connection portion 4 is electrically connected to the data line Data. Therefore, reducing the coupling capacitance between the first semiconductor connection portion 3 and the second semiconductor connection portion 4 is equivalent to reducing the coupling capacitance between the gate electrode of the driving transistor DT and the data line Data. In this way, the influence of the coupling capacitance on the driving current flowing into the light-emitting element can be reduced, so that the actual light-emitting brightness of the light-emitting element is close to the standard light-emitting brightness, thereby alleviating the crosstalk and improving the display performance.

Further, it has been found through experimental research that the coupling capacitance between the gate electrode of the driving transistor DT and the data line Data mainly includes three parts, including is a coupling capacitance formed by the first semiconductor connection portion 3 and the second semiconductor connection portion 4, a coupling capacitance formed between the data line Data and a film layer of the source/drain electrode adjacent thereto, and a coupling capacitance formed between the data line Data and a film layer of the gate electrode adjacent thereto. After further research, it has been found that a ratio of the coupling capacitances of the three parts is 10.34:2.69:1. That is, the coupling capacitance formed by the first semiconductor connection portion 3 and the second semiconductor connection portion 4 has the greatest influence on the coupling capacitance of the gate electrode of the driving transistor DT and the data line Data. Therefore, the coupling capacitance of the first semiconductor connection portion 3 and the second semiconductor connection portion 4 can be reduced through the blocking unit 2, so that the coupling capacitance of the gate electrode of the driving transistor DT and the data line Data can be reduced to a greater extent and the crosstalk can be further alleviating.

Figure 4:
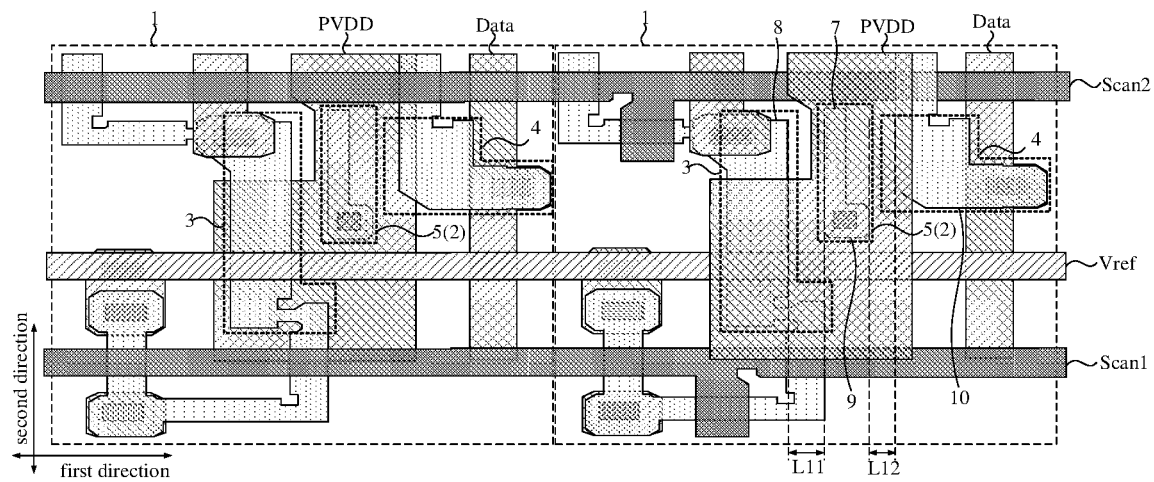
FIG. 4 is a schematic structural diagram of a layout in a case where only a first blocking unit is provided according to an embodiment of the present disclosure.
Figure 5:
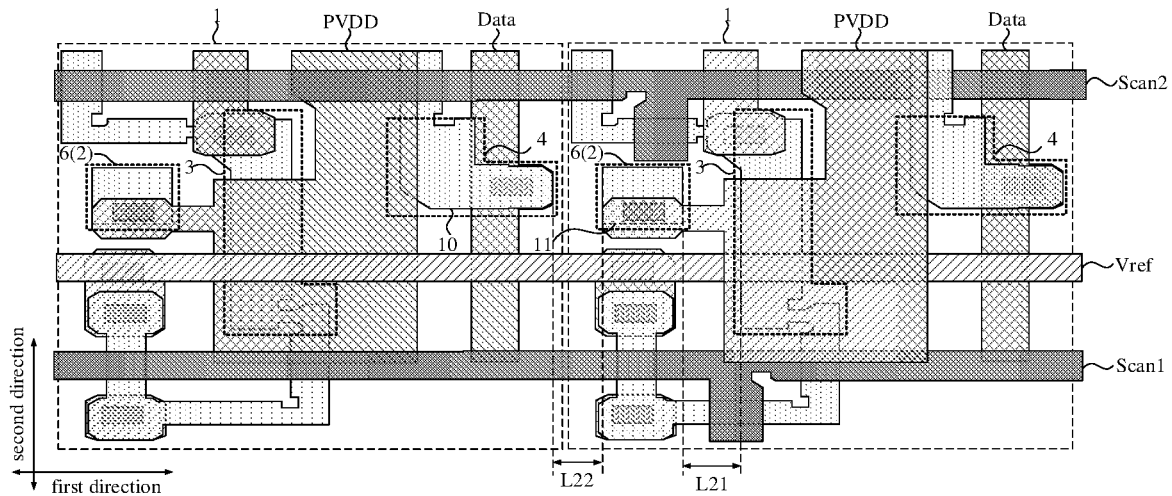
FIG. 5 is a schematic structural diagram of a layout in a case where only a second blocking unit is provided according to an embodiment of the present disclosure.
Figure 6:
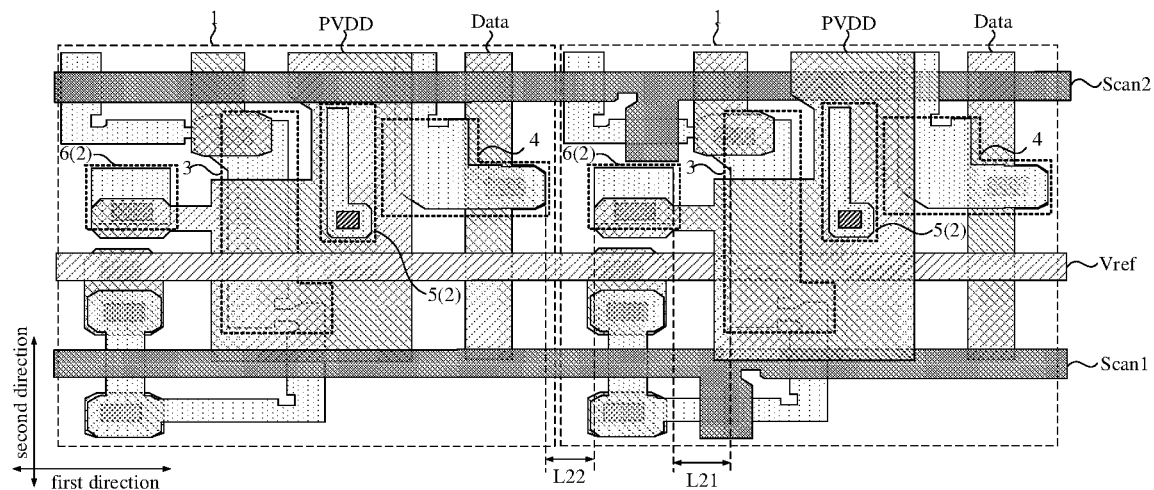
FIG. 6 is a schematic structural diagram of a layout in a case where both a first blocking unit and a second blocking unit are provided according to an embodiment of the present disclosure.

FIG. 4 is a schematic structural diagram of a layout in a case where only a first blocking unit is provided according to an embodiment of the present disclosure. FIG. 5 is a schematic structural diagram of a layout in a case where only a second blocking unit is provided according to an embodiment of the present disclosure. FIG. 6 is a schematic structural diagram of a layout in a case where both a first blocking unit and a second blocking unit are provided according to an embodiment of the present disclosure. In an embodiment, as shown in FIGS. 4-6, the blocking unit includes a first blocking unit 5 and/or a second blocking unit 6.

The first blocking unit 5 is disposed in the same layer as the first semiconductor connection portion 3 and the second semiconductor connection portion 4. The first blocking unit 5 is disposed between the first semiconductor connection portion 3 and the second semiconductor connection portion 4 of a same pixel circuit 1. The second blocking unit 6 is disposed in the same layer as the first semiconductor connection portion 3 and the second semiconductor connection portion 4. The second blocking unit 6 is disposed between a first semiconductor connection portion 3 of a pixel circuit 1 and a second semiconductor connection portion 4 of a pixel circuit 1 that is adjacent to the pixel circuit 1, to which the first semiconductor connection portion 3 belongs, in the first direction. The first direction intersects with a second direction, and the second direction is an extension direction of the data line Data.

With further reference to FIG. 4, when the blocking unit 2 includes the first blocking unit 5, the electric field lines between the first semiconductor connection portion 3 and the second semiconductor connection portion 4 of a same pixel circuit 1 can be at least partially blocked by the first blocking unit 5. In this way, the coupling capacitance between the first semiconductor connection portion 3 and the second semiconductor connection portion 4 can be reduced, thereby reducing the coupling capacitance between the gate electrode of the driving transistor DT and the data line Data electrically connected to the pixel circuit 1 including this driving transistor DT (hereinafter referred to as the gate electrode of the driving transistor DT and its own data line Data). Therefore, the crosstalk caused by the coupling capacitance can be effectively alleviating.

In an example, when the display panel is switched from a 0-grayscale image to a 127-grayscale image, under a first condition (in which the storage capacitance Cst is 149.51123 F, the power supply voltage signal Vpvdd is 4.6V, the data signal $V_{data1}$ corresponding to the 0-grayscale is 5.8V, and the data signal $V_{data2}$ corresponding to the 127-grayscale is 4.2V), it is known from I=k $(V_{pvdd}-V_{data2})$ that the ideal driving current flowing into the light-emitting element in an ideal state is I=0.16 k.

When the first blocking unit 5 is not provided, the coupling capacitance c1 between the gate electrode of the driving transistor DT and its own data line Data is 0.23270513 F, and it can be known from $$I1' = k\left(V_{pvdd} - V_{data2} - \frac{\Delta V \times c1}{c1 + Cst}\right)^2$$

that the actual driving current flowing into the light-emitting element is I1'=0.158017036 k. In this case, it can be known from $$X_{talk1} = \frac{I - I1'}{I} \times 100\%$$

that the crosstalk value is $x_{talk1}$=1.2394%.

When the first blocking unit 5 is provided, the coupling capacitance c2 between the gate electrode of the driving transistor DT and its own data line Data is 0.21312588 F, and the actual driving current flowing into the light-emitting element is I2'=0.15814894 k. In this case, the crosstalk value is $x_{talk2}$=1.1344%.

It can be seen that, compared with the case in which the first blocking unit 5 is not provided, when the first blocking unit 5 is provided, the actual driving current I2' flowing into the light-emitting element is closer to the ideal driving current I, and the crosstalk value is reduced by 8.4650%, thereby effectively alleviating the crosstalk and improving the display performance.

In addition, it should be noted that the electric field lines of the coupling electric field formed between adjacent metal film layers are diverged in various directions. Therefore, in the case where the first blocking unit 5 is provided, the first blocking unit 5 can not only block the electric field lines between the first semiconductor connection portion 3 and the second semiconductor connection portion 4 of a same pixel circuit 1, and but also block the electric field lines between the first semiconductor connection portion 3 of a pixel unit 1 and the second semiconductor connection portion 4 of a pixel circuit 1 that is adjacent to the pixel unit 1, to which the first semiconductor connection portion 3 belongs, in the first direction. In this way, the coupling capacitance between the gate electrode of the driving transistor DT and the data line Data electrically connected to the pixel circuit 1 that is adjacent to the pixel unit 1 including this driving transistor DT in the first direction (hereinafter referred to as the gate electrode of the driving transistor DT and the adjacent data line Data) can be reduced.

In an example, the display panel is switched from a 0-grayscale image to a 127-grayscale image. Under the first condition, when the first blocking unit 5 is not provided, the coupling capacitance c3 between the gate electrode of the driving transistor DT and the adjacent data line Data is 0.27194636 F, and the actual driving current flowing into the light-emitting element is I3'=0.15768447 k. In this case, the crosstalk value is $x_{talk3}$=1.4472%.

When the first blocking unit 5 is provided, the coupling capacitance c4 between the gate electrode of the driving transistor DT and the adjacent data line Data is 0.26941574 F, and the actual driving current flowing into the light-emitting element is I4'=0.157708082 k. In this case, the crosstalk value is $x_{talk4}$=1.4324%. It can be seen that the crosstalk value is reduced by 1.0197%.

With further reference to FIG. 5, when the blocking unit 2 includes the second blocking unit 6, the electric field lines formed between the first semiconductor connection portion 3 of a pixel unit 1 and the second semiconductor connection portion 4 of a pixel circuit 1 that is adjacent to, in the first direction, the pixel circuit 1 to which the first semiconductor connection portion 3 belongs, can be at least partially blocked by the second blocking unit 6. In this way, the coupling capacitance between the first semiconductor connection portion 3 and the second semiconductor connection portion 4 can be reduced, thereby reducing the coupling capacitance between the gate electrode of the driving transistor DT and the adjacent data line Data. Therefore, the crosstalk caused by the coupling capacitance can be effectively alleviating.

In an example, when the display panel is switched from a 0-grayscale image to a 127-grayscale image and under the first condition, the ideal driving current flowing into the light-emitting element in an ideal state is I=0.16 k.

When the second blocking unit 6 is not provided, the coupling capacitance c5 between the gate electrode of the driving transistor DT and the adjacent data line Data is 0.27194636 F, and the actual driving current flowing into the light-emitting element is I5'=0.157684471 k. Then, the crosstalk value $x_{talk5}$=1.4472%.

When the second blocking unit 6 is provided, the coupling capacitance c6 between the gate electrode of the driving transistor DT and the adjacent data line Data is 0.21528892 F, and the actual driving current flowing into the light-emitting element is I6'=0.158168849 k. Then, the crosstalk value $x_{talk6}$=1.1445%.

It can be seen that, compared with the case in which the second blocking unit 6 is not provided, when the second blocking unit 6 is provided, the actual driving current I6' flowing into the light-emitting element is closer to the ideal driving current I, and the crosstalk value is reduced by 20.9187%. In this way, the crosstalk is effectively alleviating.

In addition, it should be noted when the second blocking unit 6 is provided, the second blocking unit 6 can not only block the electric field lines between the first semiconductor connection portion 3 of a pixel circuit 1 and the second semiconductor connection portion 4 of a pixel circuit 1 that is adjacent to, in the first direction, the pixel circuit 1 to which this first semiconductor connection portion 3 belongs, but also block the electric field lines between the first semiconductor connection portion 3 and the second semiconductor connection portion 4 of a same pixel circuit 1. In this way, the coupling capacitance between the gate electrode of the driving transistor DT and its own data line Data can be reduced.

In an example, the display panel is switched from a 0-grayscale image to a 127-grayscale image. Under the first condition, when the second blocking unit 6 is not provided, the coupling capacitance c7 between the gate electrode of the driving transistor DT and its own data line Data is 0.23270513 F, and the actual driving current flowing into the light-emitting element is I7'=0.158017036 k. Then, the crosstalk value is $x_{talk7}$=1.2394%.

When the second blocking unit 6 is provided, the coupling capacitance c8 between the gate electrode of the driving transistor DT and its own data line Data is 0.23147891 F, and the actual driving current flowing into the light-emitting element is I8'=0.158031782 k. In this case, the crosstalk value is $x_{talk8}$=1.2301%. It can be seen that the crosstalk value is reduced by 0.7436%.

With further reference to FIG. 6, when the blocking unit 2 includes both the first blocking unit 5 and the second blocking unit 6, the first blocking unit 5 can greatly improve the coupling effect between the gate electrode of the driving transistor DT and its own data line Data, and can lightly improve the coupling effect between the gate electrode of the driving transistor DT and the adjacent data line Data. Meanwhile, the second blocking unit 6 can greatly improve the coupling effect between the gate electrode of the driving transistor DT and the adjacent data line Data, and can lightly improve the coupling effect between the gate electrode of the driving transistor DT and its own data line Data. It can be seen that when both the first blocking unit 5 and the second blocking unit 6 are provided, both the coupling effect between the gate electrode of the driving transistor DT and the adjacent data line Data and the coupling effect between the gate electrode of the driving transistor DT and its own data line Data can be greatly improved. In this way, the crosstalk caused by the coupling effect can be further greatly alleviating.

In an example, when the display panel is switched from a 0-grayscale image to a 127-grayscale image, under the first condition, the crosstalk value can be reduced by 21.1082% by improving the coupling effect between the gate electrode of the driving transistor DT and the adjacent data line Data, and the crosstalk value can be reduced by 9.848% by improving the coupling effect between the gate electrode of the driving transistor DT and its own data line Data.

Further, with further reference to FIG. 4, the first blocking unit 5, the first semiconductor connection portion 3, and the second semiconductor connection portion 4 each have an upper edge and a lower edge that extend in the first direction. The edge close to the second scanning signal line Scan2 is referred to as the upper edge, and the edge close to the reference voltage signal line Vref is referred to as the lower edge.

An extension line of the upper edge 7 of the first blocking unit 5 is located between the upper edge 8 of the first semiconductor connection portion 3 and the second scanning signal line Scan2, and an extension line of the lower edge 9 of the first blocking unit 5 is located between the lower edge 10 of the second semiconductor connection portion 4 and the reference voltage signal line Vref, so that the electric field lines between the first semiconductor connection portion 3 and the second semiconductor connection portion can be blocked by the first blocking unit 5 as much as possible, thereby further reducing the coupling capacitance between the gate electrode of the driving transistor DT and its own data line Data.

Further, with reference to FIG. 5, the second blocking unit 6 has an upper edge and a lower edge than extend in the first direction. Here, the edge close to the second scanning signal line Scan2 is referred to as the upper edge, and the edge close to the reference voltage signal line Vref is referred to as the lower edge. An extension line of the lower edge 11 of the second blocking unit 6 is located between the lower edge of the second semiconductor connection portion 4 and the reference voltage signal line Vref, so that the electric field lines between the first semiconductor connection portion 3 and the second semiconductor connection portion can be blocked by the second blocking unit 6 as much as possible, thereby further reducing the coupling capacitance between the gate electrode of the driving transistor DT and the adjacent data line Data.

In an embodiment, the first blocking unit 5 and the second blocking unit 6 may be located on a semiconductor layer. In this case, the first blocking unit 5 and/or the second blocking unit 6, the first semiconductor connection portion 3 and the second semiconductor connection portion 4 can be formed by a same patterning process, which can simplify the manufacturing process, thereby reducing the process costs.

In another embodiment, the first blocking unit 5 and the second blocking unit 6 may also be located on a metal layer with better blocking performance. In this case, the first semiconductor connection portion 3 and the second semiconductor connection portion 4 can be formed by one patterning process, and then the first blocking unit 5 and/or the second blocking unit 6 can be formed between the first semiconductor connection portion 3 and the second semiconductor connection portion 4 by another patterning process.

In an embodiment, the first blocking unit 5 and the second blocking unit 6 may be electrically connected to the power supply voltage signal line PVDD. That is, a power supply voltage signal transmitted by the power supply voltage signal line PVDD is used as a fixed voltage signal. Compared with other fixed voltage signal, the power supply voltage signal is directly provided by a driving chip and has a stable strength. Therefore, the first blocking unit 5 and the second blocking unit 6 being electrically connected to the power supply voltage signal line PVDD can achieve a better blocking effect.

In an embodiment, with further reference to FIG. 4, a distance between the first blocking unit 5 and the first semiconductor connection portion 3 closest to this first blocking unit 5 is L11, and a distance between the first blocking unit 5 and the second semiconductor connection portion 4 closest to this first blocking unit 5 is L12. Here, L11≥2 μm, and L12≥2 μm. With further reference to FIG. 5, a distance between the second blocking unit 6 and the first semiconductor connection portion 3 closest to this second blocking unit 6 is L21, and a distance between the second blocking unit 6 and the second semiconductor connection portion 4 closest to this second blocking unit 6 is L22. Here, L21≥2 μm, and L22≥2 μm.

Taking the first blocking unit 5 as an example, the minimum value of L11 and L12 is set to 2 μm, so that the first blocking unit 5 is prevented from being too close to the first semiconductor connection portion 3 and the second semiconductor connection portion 4. On the one hand, in a case where the first blocking unit 5 is a semiconductor layer, unetching between the first blocking unit 5 and the first semiconductor connection portion 3 and unetching between the first blocking unit 5 and the second semiconductor connection portion 4 can be avoided. On the other hand, the mutual interference between a signal transmitted on the first blocking unit 5 and signals transmitted on the first semiconductor connection portion 3 and the second semiconductor connection portion 4 can be reduced. The second blocking unit 6 is in the same situation, and will not be further described herein.

Figure 7:
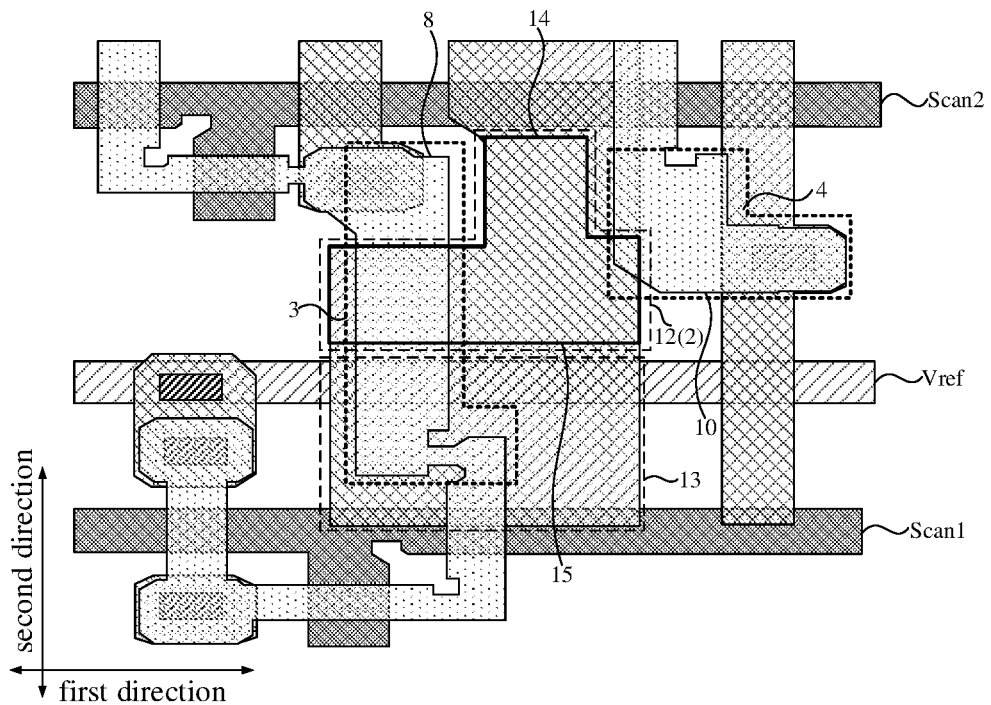
FIG. 7 is a schematic structural diagram of a layout of a blocking unit according to an embodiment of the present disclosure.
Figure 8:
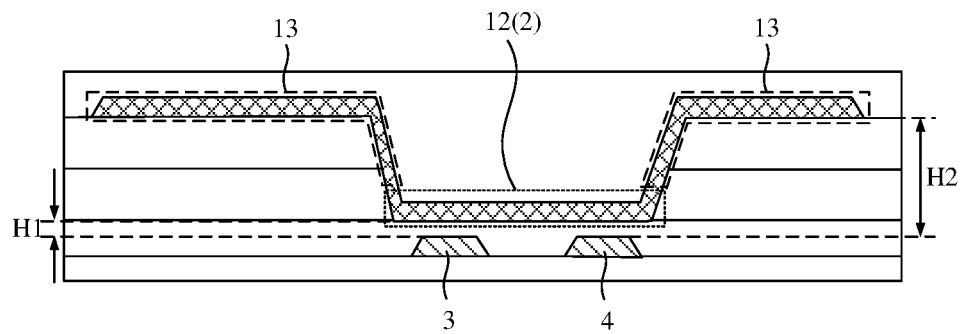
FIG. 8 is a schematic diagram of a film layer structure of a first trace segment, a second trace segment, a first semiconductor connection portion, and a second semiconductor connection portion according to an embodiment of the present disclosure.

FIG. 7 is a schematic structural diagram of a layout of a blocking unit according to an embodiment of the present disclosure. FIG. 8 is a schematic diagram of a film layer structure of a first trace segment, a second trace segment, a first semiconductor connection portion, and a second semiconductor connection portion according to an embodiment of the present disclosure. As shown in FIG. 7 and FIG. 8, the power supply voltage signal line PVDD includes a first trace segment 12 and a second trace segment 13 connected to the first trace segment 1. Here, an orthographic projection of a portion of the first trace segment 12 on a plane of the first semiconductor connection portion 3 and the second semiconductor connection portion 4 is located between the first semiconductor connection portion 3 and the second semiconductor connection portion 4, and an orthographic projection of the remaining portion of the first trace segment 12 on the plane of the first semiconductor connection portion 3 and the second semiconductor connection portion 4 at least partially overlaps with the first semiconductor connection portion 3 and the second semiconductor connection portion 4.

A distance between a film layer of the first trace segment 12 and the film layer of the first semiconductor connection portion 3 and the second semiconductor connection portion 4 in a direction perpendicular to a plane of the display panel is H1, and a distance between a film layer of the second trace segment 13 and the film layer of the first semiconductor connection portion 3 and the second semiconductor connection portion 4 in the direction perpendicular to the plane of the display panel is H2. Here, H1 is smaller than H2. The blocking unit 2 is the first trace segment 12.

It should be noted that the orthographic projection of the remaining portion of the first trace segment 12 on the plane of the first semiconductor connection portion 3 and the second semiconductor connection portion 4 at least partially overlapping with the first semiconductor connection portion 3 and the second semiconductor connection portion 4 means that the orthographic projection of the entire remaining portion of the first trace segment 12 on the plane of the first semiconductor connection portion 3 and the second semiconductor connection portion 4 totally overlaps with the first semiconductor connection portion 3 and the second semiconductor connection portion 4, or the orthographic projection of a part of the remaining portion of the first trace segment 12 on the plane of the first semiconductor connection portion 3 and the second semiconductor connection portion 4 overlaps with the first semiconductor connection portion 3 and the second semiconductor connection portion 4 while the other part of the remaining portion of the first trace segment 12 on the plane of the first semiconductor connection portion 3 and the second semiconductor connection portion 4 does not overlap with the first semiconductor connection portion 3 and the second semiconductor connection portion 4. Moreover, the second trace segment 13 refers to the remaining trace segment of the power supply voltage signal line PVDD other than the first trace segment 12.

In this embodiment, the orthographic projection of a portion of the first trace segment 12 on the plane of the first semiconductor connection portion 3 and the second semiconductor connection portion 4 is located between the first semiconductor connection portion 3 and the second semiconductor connection portion 4, and the orthographic projection of the remaining portion of the first trace segment 12 on the plane of the first semiconductor connection portion 3 and the second semiconductor connection portion 4 at least partially overlaps with the first semiconductor connection portion 3 and the second semiconductor connection portion 4. The distance H1 between the film layer of the first trace segment 12 and the film layer of the first semiconductor connection portion 3 and the second semiconductor connection portion 4 in the direction perpendicular to the plane of the display panel is further reduced, so that when a coupling effect is generated between the first semiconductor connection portion 3 and the second semiconductor connection portion 4 and a coupling electric field is therefore formed, the first trace segment 12 can block the electric field lines formed therebetween as much as possible, so as to reduce the coupling capacitance between the first semiconductor connection portion 3 and the second semiconductor connection portion 4. In this way, the coupling capacitance between the gate electrode of the driving transistor DT and the data line Data can be reduced, thereby reducing the influence of the coupling capacitance on the driving current flowing into the light-emitting element. Thus, the actual light-emitting brightness of the light-emitting element can be close to the standard light-emitting brightness, and the crosstalk can be alleviated and the display performance can be improved.

Further, in an embodiment, 0.08 μm≤H1≤0.9 μm. With a minimum value of H1 being 0.08 μm, the film layer of the first trace segment 12 has a certain distance from the film layer of the first semiconductor connection portion 3 and the second semiconductor connection portion 4, so that direct contact therebetween can be avoided, thereby avoiding mutual influence of a signal transmitted on the power supply voltage signal line PVDD and signals transmitted on the first semiconductor connection portion 3 and the second semiconductor connection portion 4. With a maximum value of H1 being 0.9 μm, the film layer of the first trace segment 12 can be close to the film layer of the first semiconductor connection portion 3 and the second semiconductor connection portion 4, so that the blocking effect of the first trace segment 12 on the electric field lines between the first semiconductor connection portion 3 and the second semiconductor connection portion 4 can be improved, thereby further reducing the coupling capacitance between the first semiconductor connection portion 3 and the second semiconductor connection portion 4.

In an example, when the display panel is switched from a 0-grayscale image to a 127-grayscale image, under the first condition, if the distance between the film layer of the first trace segment 12 and the film layer of the first semiconductor connection portion 3 and the second semiconductor connection portion 4 in the direction perpendicular to the plane of display panel is not reduced, the coupling capacitance value c9 between the gate electrode of the driving transistor DT and its own data line Data will be 0.23270513 F, and the actual driving current flowing into the light emitting element will be I9'=0.158017036 k. Then, the crosstalk value is $x_{talk9}$=1.2394%.

When the distance between the film layer of the first trace segment 12 and the film layer of the first semiconductor connection portion 3 and the second semiconductor connection portion 4 in the direction perpendicular to the plane of display panel is reduced, for example, H1 is reduced to 0.08 μm, the coupling capacitance value c10 between the gate electrode of the driving transistor DT and its own data line Data will be 0.19648420 F, and the actual driving current flowing into the light-emitting element will be I10'=0.158324471 k. Then, the crosstalk value is $X_{talk10}$=1.0472%. It can be seen that the crosstalk value is reduced by 15.5038%, which effectively alleviates the crosstalk.

In addition, it should be noted that when the distance between the film layer of the first trace segment 12 and the film layer of the first semiconductor connection portion 3 and the second semiconductor connection portion 4 in the direction perpendicular to the plane of display panel is reduced, the first trace segment 12 can not only block the electric field lines between the first semiconductor connection portion 3 and the second semiconductor connection portion 4 of a same pixel circuit 1, but also block the electric field lines between the first semiconductor connection portion 3 of a pixel circuit 1 and the second semiconductor connection portion 4 of a pixel circuit 1 that is adjacent to, in the first direction, the pixel circuit 1 to which the first semiconductor connection portion 3 belongs, in a certain extent. In this way, the coupling capacitance between the gate electrode of the driving transistor DT and the adjacent data line Data can be reduced.

In an example, when the display panel is switched from a 0-grayscale image to a 127-grayscale image, under the first condition, if the distance between the film layer of the first trace segment 12 and the film layer of the first semiconductor connection portion 3 and the second semiconductor connection portion 4 in the direction perpendicular to the plane of display panel is not reduced, the coupling capacitance value c10 between the gate electrode of the driving transistor DT and the adjacent data line Data will be 0.27194636 F, and the actual driving current flowing into the light emitting element will be I11'=0.157684471 k. Then, the crosstalk value is $x_{talk11}$=1.4472%.

When the distance between the film layer of the first trace segment 12 and the film layer of the first semiconductor connection portion 3 and the second semiconductor connection portion 4 in the direction perpendicular to the plane of display panel is reduced, for example, H1 is reduced to 0.08 μm, the coupling capacitance value c12 between the gate electrode of the driving transistor DT and the adjacent data line Data will be 0.25173464 F, and the actual driving current flowing into the light-emitting element will be I12'=0.157855697 k. Then, the crosstalk value is $x_{talk12}$=1.3402%. It can be seen that the crosstalk value is reduced by 7.3947%.

In an embodiment, with further reference to FIG. 7, the blocking unit 2 is shaped similarly as a Chinese character, "門". Further, the blocking unit 2, the first semiconductor connection portion 3, and the second semiconductor connection portion 4 each have an upper edge and a lower edge that extend in the first direction. The edge close to the second scanning signal line Scan2 is referred to as the upper edge, and the edge close to the reference voltage signal line Vref is referred to as the lower edge An extension line of the upper edge 14 of the blocking unit 2 is located between the upper edge of the first semiconductor connection portion 3 and the second scanning signal line Scan2, and an extension line of the lower edge 15 of the blocking unit 2 is located at a side of the lower edge of the second semiconductor connection portion 4 facing the reference voltage signal line Vref, so that the electric field lines between the first semiconductor connection portion 3 and the second semiconductor connection portion can be blocked by the blocking unit 2 as much as possible, thereby further reducing the coupling capacitance between the gate electrode of the driving transistor DT and its own data line Data.

Figure 9:
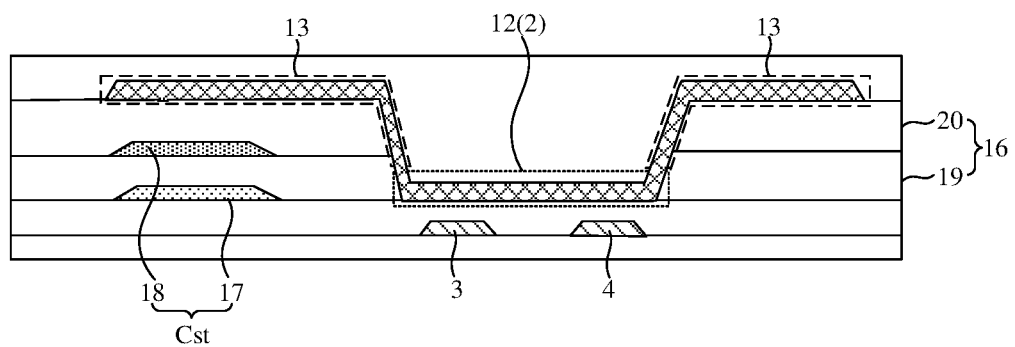
FIG. 9 is a schematic structural diagram of a film layer of a first insulation layer according to an embodiment of the present disclosure.

FIG. 9 is a schematic structural diagram of a film layer of a first insulation layer according to an embodiment of the present disclosure. As shown in FIG. 9, the display panel further includes a first insulation layer 16 located between a film layer of the power supply voltage signal line PVDD and the film layer of the first semiconductor connection portion 3 and the second semiconductor connection portion 4. Moreover, in order to reduce the distance between the film layer of the first trace segment 12 and the film layer of the first semiconductor connection portion 3 and the second semiconductor connection portion 4 in the direction perpendicular to the plane of display panel so as to reduce the coupling capacitance between the first semiconductor connection portion 3 and the second semiconductor connection portion 4, an area corresponding to the blocking unit 2 (the first trace segment 12) in the first insulation layer 16 may be hollowed out.

Combination with FIG. 2 and FIG. 3, and with further reference to FIG. 9, the pixel circuit 1 further includes a storage capacitor Cst. The storage capacitor Cst includes a first electrode pate 17 and a second electrode pate 18. The first electrode pate 17 is electrically connected to the gate electrode of the driving transistor, and the second electrode pate 18 is electrically connected to the power supply voltage signal line PVDD. The first insulation layer 16 includes a first insulation sub-layer 19 and a second insulation sub-layer 20. The first insulation sub-layer 19 is located between a film layer of the first electrode pate 17 and a film layer of the second electrode pate 18. The second sub-insulating layer 20 is located between the film layer of the second electrode pate 18 and the film layer of the power supply voltage signal line PVDD. Moreover, in order to reduce the distance between the film layer of the first trace segment 12 and the film layer of the first semiconductor connection portion 3 and the second semiconductor connection portion 4 in the direction perpendicular to the plane of display panel, an area corresponding to the blocking unit 2 (the first trace segment 12) in the first insulation sub-layer 19 is hollowed out, and/or an area corresponding to the blocking unit 2 (the first trace segment 12) in the second insulation sub-layer 20 is hollowed out.

Figure 10:
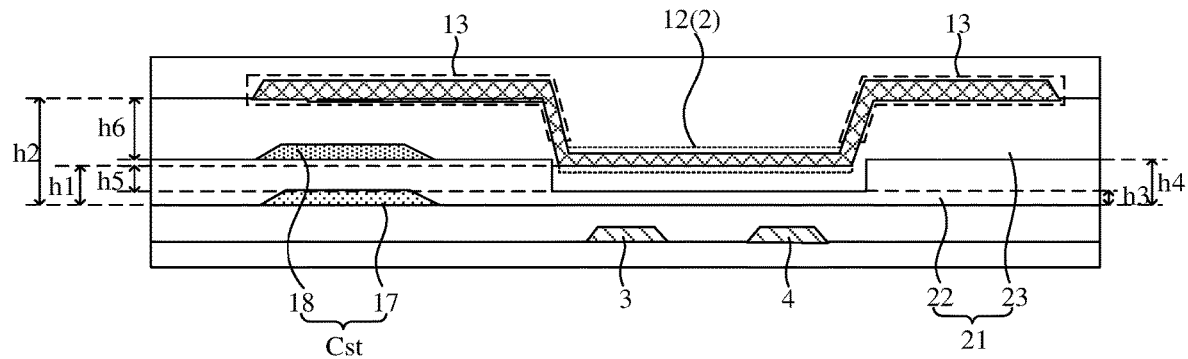
FIG. 10 is a schematic structural diagram of a film layer of a second insulation layer according to an embodiment of the present disclosure.

FIG. 10 is a schematic structural diagram of a film layer of a second insulation layer according to an embodiment of the present disclosure. In an embodiment, as shown in FIG. 10, the display panel further includes a second insulation layer 21 located between the film layer of the power supply voltage signal line PVDD and the film layer of the first semiconductor connection portion 3 and the second semiconductor connection portion 4. Moreover, in order to reduce the distance between the film layer of the first trace segment 12 and the film layer of the first semiconductor connection portion 3 and the second semiconductor connection portion 4 in the direction perpendicular to the plane of display panel so as to reduce the coupling capacitance between the first semiconductor connection portion 3 and the second semiconductor connection portion 4, an area corresponding to the blocking unit 2 (the first trace segment 12) in the second insulation layer 21 may be set to have a thickness h1 smaller than a thickness h2 of an area corresponding to the second trace segment 13 in the second insulation layer 21.

It should be noted that in the manufacturing process of the display panel, the second insulation layer 21 may be formed by a half-tone process. Controlling respective transmittances of different areas of the mask can allow the etched second insulation layer 21 to have different thicknesses in the different areas.

With further reference to FIG. 10, the second insulation layer 21 includes a third insulation sub-layer 22 and a fourth insulation sub-layer 23. The third insulation sub-layer 22 is located between the film layer of the first electrode pate 17 and the film layer of the second electrode pate 18, and the fourth insulation sub-layer 23 is located between the film layer of the second electrode pate 18 and the film layer of the power supply voltage signal line PVDD. Moreover, in order to reduce the distance between the film layer of the first trace segment 12 and the film layer of the first semiconductor connection portion 3 and the second semiconductor connection portion 4 in the direction perpendicular to the plane of the display panel, an area corresponding to the blocking unit 2 (the first trace segment 12) in the third insulation sub-layer 22 may be set to have a thickness h3 smaller than a thickness h4 of an area corresponding to the second trace segment 13 in the third insulation sub-layer 22, and/or an area corresponding to the blocking unit 2 (the first trace segment 12) in the fourth insulation sub-layer 23 may be set to have a thickness h5 smaller than a thickness h6 of an area corresponding to the second trace segment 13 in the fourth insulation sub-layer 23.

Figure 11:
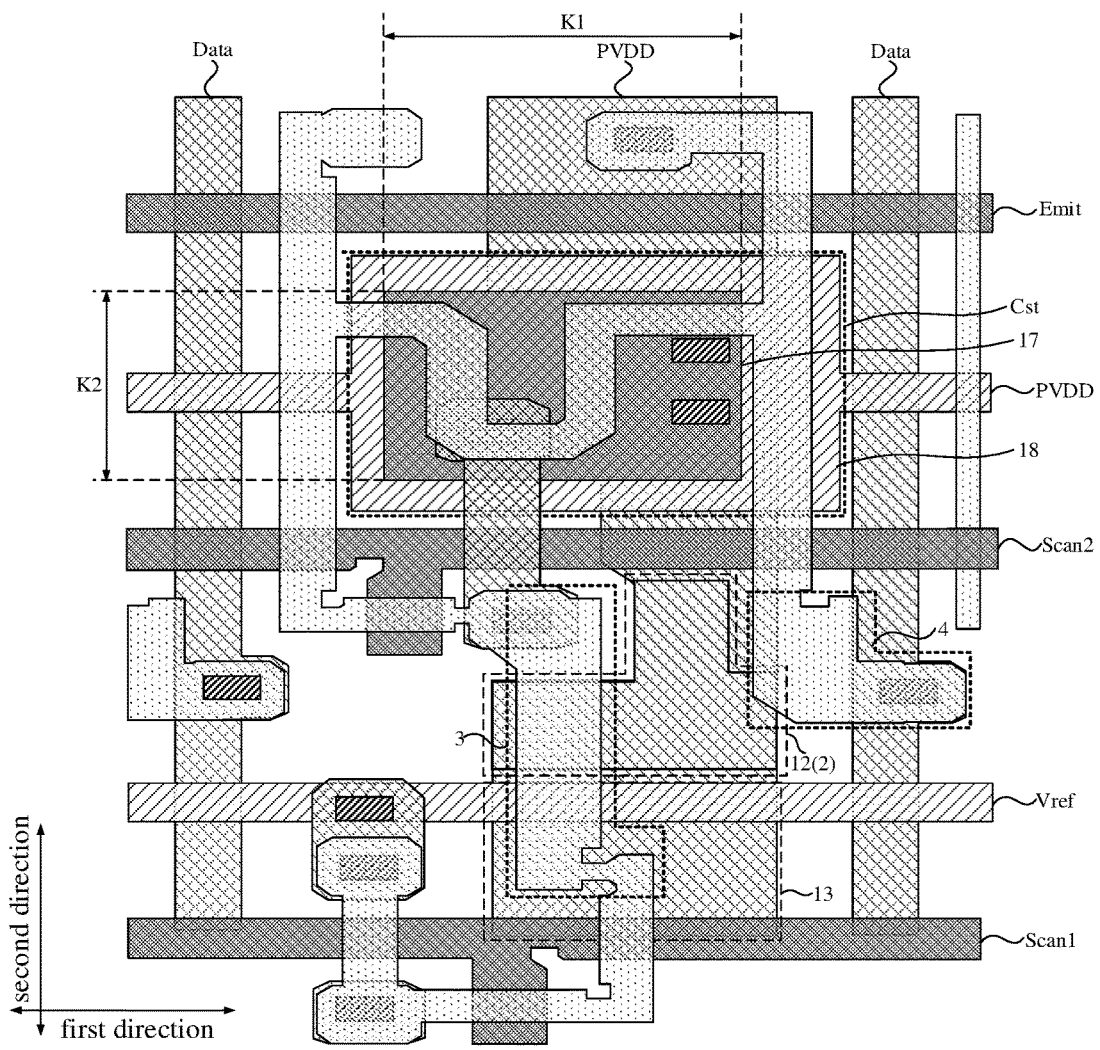
FIG. 11 is a schematic structural diagram of a layout of a storage capacitor according to an embodiment of the present disclosure.

FIG. 11 is a schematic structural diagram of a layout of a storage capacitor according to an embodiment of the present disclosure. As shown in FIG. 11, the first electrode pate 17 of the storage capacitor Cst has a length K1 in the first direction that is larger than or equal to a length K2 of the first electrode pate 17 in the second direction. Increasing the length of the first electrode pate 17 in the first direction can allow the length of the first electrode pate 17 in the second direction to be reduced, so that a distance between the first electrode pate 17 and the adjacent light-emitting control signal line Emit and second scanning signal line Scan2 can be increased. In this way, mutual interference of a signal transmitted on the first electrode pate 17 and signals transmitted on the light-emitting control signal line Emit and the second scanning signal line Scan2 can be avoided.

In an embodiment, with further reference to FIG. 2 and FIG. 3, the pixel circuit 1 further includes a fourth switch transistor T4, a fifth switch transistor T5, and a sixth switch transistor T6. The fourth switch transistor T4 has a gate electrode electrically connected to the second scanning signal line Scan2, a first electrode electrically connected to the gate electrode of the driving transistor DT, and a second electrode electrically connected to the second electrode of the driving transistor DT. The fifth switch transistor T5 has a gate electrode electrically connected to the light-emitting control signal line Emit, a first electrode electrically connected to the second electrode of the driving transistor DT, and a second electrode electrically connected to the light-emitting element. The sixth switch transistor T6 has a gate electrode electrically connected to the first scanning signal line Scan1, a first electrode electrically connected to the reference voltage signal line Vref, and a second electrode electrically connected to the light-emitting element.

The pixel circuit 1 has a working principle that is the same as that of the related art, and details thereof will not be further described herein.

Figure 12:
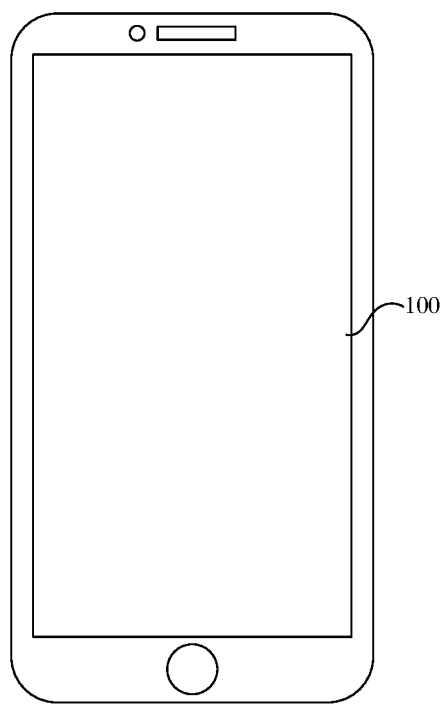
FIG. 12 is a schematic structural diagram of a display device according to an embodiment of the present disclosure.

The present disclosure further provides a display device. FIG. 12 is a schematic structural diagram of a display device according to an embodiment of the present disclosure. As shown in FIG. 12, the display device includes the display panel 100. A specific structure of the display panel 100 has been described in details in the above embodiments and will not be further described herein. It should be understood that the display device shown in FIG. 12 is merely illustrative, and the display device may be any electronic device having a display function, such as a cellphone, a tablet computer, a notebook computer, an electronic paper book, or a television.

The display device provided by this embodiment of the present disclosure includes the display panel 100 described above. Therefore, with this display device, the coupling capacitance between the gate electrode of the driving transistor DT and the data line Data can be reduced. In this way, the influence of the coupling capacitance on the driving current flowing into the light-emitting element can be reduced, so that the actual light-emitting brightness of the light-emitting element can be close to the standard light-emitting brightness, thereby alleviating the crosstalk and improving the display performance.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
   a plurality of pixel circuits arranged in a matrix; and
   a blocking unit,
   wherein each of the plurality of pixel circuits comprises:
   a driving transistor having a gate electrode and a first electrode;
   a first switch transistor having a gate electrode electrically connected to a first scanning signal line, a first electrode electrically connected to a reference voltage signal line, and a second electrode electrically connected to the gate electrode of the driving transistor;
   a second switch transistor, having a gate electrode electrically connected to a second scanning signal line, a first electrode electrically connected to a data line, and a second electrode electrically connected to the first electrode of the driving transistor; and
   a third switch transistor having a gate electrode electrically connected to a light-emitting control signal line, a first electrode electrically connected to a power supply voltage signal line, and a second electrode electrically connected to the first electrode of the driving transistor,
   wherein the blocking unit is configured to receive a fixed potential signal, and at least a partial area of the blocking unit is located between a first semiconductor connection portion and a second semiconductor connection portion, the first semiconductor connection portion is a semiconductor electrically connected between the second electrode of the first switch transistor and the gate electrode of the driving transistor, and the second semiconductor connection portion is a semiconductor electrically connected between the first electrode of the second switch transistor and the data line, and
   wherein the power supply voltage signal line at least partially overlaps with the gate electrode of the driving transistor and at least partially overlaps a semiconductor connection portion located between the second switch transistor and the third switch transistor.

2. The display panel according to claim 1, wherein each of the plurality of pixel circuits further comprises a storage capacitor having a first electrode plate electrically connected to the gate electrode of the driving transistor and a second electrode plate electrically connected to the power supply voltage signal line, and
   wherein the first scanning signal line extends in a first direction, and in the first direction, a first edge of the second electrode plate is located between the data line and the semiconductor connection portion located between the second switch transistor and the third switch transistor.

3. The display panel according to claim 2, wherein each of the plurality of pixel circuits further comprises:
   a fourth switch transistor having a gate electrode electrically connected to the second scanning signal line, a first electrode electrically connected to the gate electrode of the driving transistor, and a second electrode electrically connected to the second electrode of the driving transistor;
   a fifth switch transistor having a gate electrode electrically connected to the light-emitting control signal line, a first electrode electrically connected to the second electrode of the driving transistor, and a second electrode electrically connected to a light-emitting element; and
   wherein in the first direction, a second edge of the second electrode plate is located between an edge of the first electrode plate and a semiconductor connection portion located between the forth switch transistor and the fifth switch transistor.

4. The display panel according to claim 1, wherein the power supply voltage signal line at least partially overlaps with each of the first semiconductor connection portion, the second semiconductor connection portion, and the blocking unit in a first direction.

5. The display panel according to claim 1, wherein the first semiconductor connection portion is connected to the gate electrode of the driving transistor through a first metal connection portion; and the power supply voltage signal line has a first notch region in which at least a part of the first metal connection portion is located.

6. The display panel according to claim 1, wherein each of the plurality of pixel circuits further comprises:
   a fifth switch transistor, and
   a sixth switch transistor having a gate electrode electrically connected to the first scanning signal line, a first electrode electrically connected to the reference voltage signal line, and a second electrode electrically connected to a light-emitting element; and
   wherein a semiconductor portion of the sixth switch transistor and a semiconductor portion of the fifth switch transistor each are not continuous, and the sixth switch transistor is connected to the fifth switch transistor through a metal connection portion.

7. The display panel according to claim 1, wherein the blocking unit comprises a first blocking unit, wherein the first blocking unit, the first semiconductor connection portion, and the second semiconductor connection portion each have an upper edge and a lower edge that extend in a first direction, the upper edge being close to the second scanning signal line and the lower edge being close to the reference voltage signal line; and
- an extension line of the upper edge of the first blocking unit is located between the upper edge of the first semiconductor connection portion and the second scanning signal line, and an extension line of the lower edge of the first blocking unit is located between the lower edge of the second semiconductor connection portion and the reference voltage signal line.

8. The display panel according to claim 1, wherein the blocking unit comprises a first blocking unit and a second blocking unit, each of which is a semiconductor layer.

9. The display panel according to claim 1, wherein the blocking unit comprises a first blocking unit and a second blocking unit, each of which is a metal layer.

10. The display panel according to claim 1, wherein the blocking unit comprises a first blocking unit and a second blocking unit, each of which is electrically connected to the power supply voltage signal line.

11. The display panel according to claim 1, wherein the blocking unit comprises a first blocking unit and a second blocking unit, wherein a distance between the first blocking unit and the first semiconductor connection portion closest to the first blocking unit is L11, and a distance between the first blocking unit and the second semiconductor connection closest to the first blocking unit is L12, where L11≥2 μm and L12≥2 μm; and
- a distance between the second blocking unit and the first semiconductor connection portion closest to the second blocking unit is L21, and a distance between the second blocking unit and the second semiconductor connection portion closest to the second blocking unit is L22, where L21≥2 μm and L22≥2 μm.

12. The display panel according to claim 1, wherein the blocking unit comprises a first blocking unit located between the first semiconductor connection portion and the second semiconductor connection portion of one of the plurality of pixel circuits;
- the first blocking unit, the first semiconductor connection portion, and the second semiconductor connection portion each have an upper edge and a lower edge that extend in a first direction, the upper edge being close to the second scanning signal line and the lower edge being close to the reference voltage signal line;
- an extension line of the upper edge of the first blocking unit is located between the upper edge of the first semiconductor connection portion and the second scanning signal line, and an extension line of the lower edge of the first blocking unit is located between the lower edge of the second semiconductor connection portion and the reference voltage signal line; and
- the extension line of the upper edge of the first blocking unit is located between a widened portion of the second semiconductor connection portion and the second scanning signal line, wherein a width of the widened portion in a row direction is greater than a width of a semiconductor portion of the second switch transistor.

13. The display panel according to claim 1, wherein the blocking unit does not overlap with the second semiconductor connection portion.

14. The display panel according to claim 1, wherein the blocking unit in connected to the power supply voltage signal line through a first through hole, wherein the first through hole does not overlap with the first semiconductor connection portion.

15. The display panel according to claim 1, wherein the blocking unit comprises a second blocking unit, wherein the second blocking unit is located between the first semiconductor connection portion of one of the plurality of pixel circuits and the second semiconductor connection portion of another one of the plurality of pixel circuits that is adjacent to the one of the plurality of pixel circuits, and a first direction interests a second direction along which the data line extends;
- the second blocking unit, the first semiconductor connection portion, and the second semiconductor connection portion each have an upper edge and a lower edge that extend in the first direction, the upper edge being close to the second scanning signal line and the lower edge being close to the reference voltage signal line; and
- an extension line of the lower edge of the second blocking unit is located between the lower edge of the second semiconductor connection portion and the reference voltage signal line.

16. The display panel according to claim 1, wherein the power supply voltage signal line comprises a first trace segment and a second trace segment connected to the first trace segment, wherein an orthographic projection of a portion of the first trace segment on a plane of the first semiconductor connection portion and the second semiconductor connection portion is located between the first semiconductor connection portion and the second semiconductor connection portion, and an orthographic projection of a remaining portion of the first trace segment on the plane of the first semiconductor connection portion and the second semiconductor connection portion at least partially overlaps with the first semiconductor connection portion and the second semiconductor connection portion;
- a distance between a film layer of the first trace segment and a film layer of the first semiconductor connection portion and the second semiconductor connection portion in a direction perpendicular to a plane of the display panel is smaller than a distance between a film layer of the second trace segment and the film layer of the first semiconductor connection portion and the second semiconductor connection portion in the direction perpendicular to the plane of the display panel; and
- the blocking unit is the first trace segment.

17. The display panel according to claim 16, wherein the blocking unit is in a shape of a Chinese character "品";
- the blocking unit, the first semiconductor connection portion, and the second semiconductor connection portion each have an upper edge and a lower edge that extend in a first direction, the upper edge being close to the second scanning signal line and the lower edge being close to the reference voltage signal line; and
- an extension line of the upper edge of the blocking unit is located between the upper edge of the first semiconductor connection portion and the second scanning signal line, and an extension line of the lower edge of the blocking unit is located at a side of the lower edge of the second semiconductor connection portion facing towards the reference voltage signal lin.

18. The display panel according to claim 16, further comprising a first insulation layer located between a film layer of the power supply voltage signal line and the film layer of the first semiconductor connection portion and the second semiconductor connection portion; and
- an area corresponding to the blocking unit in the first insulation layer is hollowed out.

19. A display panel, comprising:
a plurality of pixel circuits arranged in a matrix; and
a blocking unit,
wherein each of the plurality of pixel circuits comprises:
a driving transistor having a gate electrode and a first electrode;
a first switch transistor having a gate electrode electrically connected to a first scanning signal line, a first electrode electrically connected to a reference voltage signal line, and a second electrode electrically connected to the gate electrode of the driving transistor;
a second switch transistor, having a gate electrode electrically connected to a second scanning signal line, a first electrode electrically connected to a data line, and a second electrode electrically connected to the first electrode of the driving transistor; and
a third switch transistor having a gate electrode electrically connected to a light-emitting control signal line, a first electrode electrically connected to a power supply voltage signal line, and a second electrode electrically connected to the first electrode of the driving transistor,
wherein the blocking unit is configured to receive a fixed potential signal, and at least a partial area of the blocking unit is located between a first semiconductor connection portion and a second semiconductor connection portion, the first semiconductor connection portion is a semiconductor electrically connected between the second electrode of the first switch transistor and the gate electrode of the driving transistor, and the second semiconductor connection portion is a semiconductor electrically connected between the first electrode of the second switch transistor and the data line, and
wherein, in at least a part of a region of the gate of the driving transistor, a length of an overlapping part between the power supply voltage signal line and the gate electrode of the driving transistor in a first direction is greater than a half of a length of the gate electrode of the driving transistor in the first direction.

20. A display panel, comprising:
a plurality of pixel circuits arranged in a matrix; and
a blocking unit,
wherein each of the plurality of pixel circuits comprises:
a driving transistor having a gate electrode and a first electrode;
a first switch transistor having a gate electrode electrically connected to a first scanning signal line, a first electrode electrically connected to a reference voltage signal line, and a second electrode electrically connected to the gate electrode of the driving transistor;
a second switch transistor, having a gate electrode electrically connected to a second scanning signal line, a first electrode electrically connected to a data line, and a second electrode electrically connected to the first electrode of the driving transistor; and
a third switch transistor having a gate electrode electrically connected to a light-emitting control signal line, a first electrode electrically connected to a power supply voltage signal line, and a second electrode electrically connected to the first electrode of the driving transistor,
wherein the blocking unit is configured to receive a fixed potential signal, and at least a partial area of the blocking unit is located between a first semiconductor connection portion and a second semiconductor connection portion, the first semiconductor connection portion is a semiconductor electrically connected between the second electrode of the first switch transistor and the gate electrode of the driving transistor, and the second semiconductor connection portion is a semiconductor electrically connected between the first electrode of the second switch transistor and the data line, and
wherein the power supply voltage signal line has a second notch region, and the first scanning signal line comprises an extending portion at least partially overlapping with the second notch region.

* * * * *